US006736928B2

(12) United States Patent
Kotoku

(10) Patent No.: US 6,736,928 B2
(45) Date of Patent: May 18, 2004

(54) EXPOSURE APPARATUS AND SEMICONDUCTOR DEVICE MANUFACTURING METHOD

(75) Inventor: Kenichi Kotoku, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 09/960,694

(22) Filed: Sep. 24, 2001

(65) Prior Publication Data

US 2003/0037878 A1 Feb. 27, 2003

(30) Foreign Application Priority Data

Aug. 24, 2001 (JP) .................................. 2001-255021

(51) Int. Cl.⁷ .......................... H01L 21/00; G03B 27/68
(52) U.S. Cl. ............................. 156/345.3; 156/345.1; 355/53
(58) Field of Search ...................... 156/345.1–345.5; 355/53, 50

(56) References Cited

U.S. PATENT DOCUMENTS

| 4,095,891 A | 6/1978 | Lovering ...................... 355/50 |
| 4,711,568 A | 12/1987 | Torigoe et al. ................ 355/68 |
| 5,526,093 A | * 6/1996 | Takahashi ...................... 355/53 |
| 5,883,704 A | * 3/1999 | Nishi et al. .................... 355/67 |
| 6,154,270 A | * 11/2000 | Ozawa ......................... 355/53 |

FOREIGN PATENT DOCUMENTS

JP 62-176129 8/1987

* cited by examiner

*Primary Examiner*—Parviz Hassanzadeh
(74) *Attorney, Agent, or Firm*—Fitzpatrick, Cella, Harper & Scinto

(57) ABSTRACT

An exposure apparatus for sequentially performing exposure of device patterns provided in a pattern effective area of a photo-mask (10) on to shot areas of a wafer (20), to provide excellent throughput performance, includes an illumination unit (115) for collectively illuminating the entire pattern effective area of the photo-mask contained within the illumination range with exposure light, a mask stage (114) that moves the photo-mask for the illumination range in the mask scanning direction, and a wafer stage (111) that moves the wafer for the projection range in which the pattern effective area of the photo-mask is projected in the wafer scanning direction. A control unit (140), after containing at least one shot area of the wafer within the projection range to perform exposure of device patterns provided in the pattern effective area of the photo-mask onto the one shot area of the wafer, synchronizes and controls the movements of the mask stage and the wafer stage while keeping the entire pattern effective area of the photo-mask contained within the illumination range.

12 Claims, 10 Drawing Sheets

FIG. 8

```
URL  http://www.maintain.co.jp/db/input.html

TROUBLE DB INPUT SCREEN

DATE OF OCCURRENCE  [2000/3/15]  ~4040
MODEL  [**********]  ~4010
CASE   [OPERATION DEFECT (RISING ERROR)]  ~4030
DEVICE S/N  [465NS4580001]  ~4020
EMERGENCY DEGREE  [D]  ~4050
SYMPTOM  [LED CONTINUES BLINKING AFTER
          POWERING ON]                    ~4060

REMEDY   [REENTER POWER
          (PRESS RED BUTTON AT STARTUP)]  ~4070

PROGRESS [PROVISIONALLY REMEDIED]         ~4080

(SEND) (RESET)    4100              4110              4120
LINK TO RESULT LIST DATABASE   SOFTWARE LIBRARY   OPERATING GUIDE
```

EXPOSURE APPARATUS AND SEMICONDUCTOR DEVICE MANUFACTURING METHOD

FIELD OF THE INVENTION

The present invention relates to an exposure apparatus used to form microcircuit patterns in manufacturing devices such as semiconductor chips and a method of manufacturing semiconductor devices using the exposure apparatus.

BACKGROUND OF THE INVENTION

As a conventional technology, there are two systems mainly used by an exposure apparatus for applying exposure to a mask pattern (device pattern); a step and repeat system that performs exposure (printing) of mask patterns on a photo-mask through collective illumination and a scan and repeat system that applies split illumination to a mask pattern through slits and completes a predetermined mask pattern while scanning the photo-mask and the wafer in synchronization with each other.

Furthermore, an exposure system called "flash on the fly" was proposed in the past. This is a system that completes a latent image on a wafer on a wafer stage running at a constant velocity through one-time exposure using pulse light with an extremely short life such as excimer laser light, and the this system is described in U.S. Pat. No. 4,095,891 and Japanese Patent Laid-Open No. 62-176129, etc.

However, the step and repeat system moves and stops the wafer stage repeatedly for every one shot area and must perform exposure after stopping and setting the shot area at a predetermined pattern projection position, while the scan and repeat system needs a cycle of accelerating the wafer stage for every one shot, performing exposure when the stage reaches a constant velocity area and decelerating the stage after exposure. Thus, it is necessary to control the complicated movement of the stage required for exposure in synchronization with optical elements, which causes throughput to decrease.

On the other hand, the flash on the fly system moves the wafer stage at a constant velocity, but since exposure onto one shot area of a wafer is performed with one-time emission of pulse light with an extremely short life, the exposure energy of the pulse light must be stabilized exactly. With such energy control, it is quite difficult to achieve desired accuracy even if the discharge voltage, gas pressure or gas circulation velocity, etc., are controlled.

SUMMARY OF THE INVENTION

The present invention has been proposed to solve the conventional problems, and has as its object to provide an exposure apparatus and a method of manufacturing semiconductor devices using the exposure apparatus characterized by having the following configuration. That is, the present invention provides an exposure apparatus that performs exposure of device patterns provided in the pattern effective area of a photo-mask sequentially onto shots of a wafer, the apparatus comprising:

an illumination unit that collectively illuminates the entire pattern effective area of the photomask contained in the illumination range with exposure light;

a mask stage that moves the photo-mask in the mask scanning direction for the illumination range;

a wafer stage that moves the wafer in the wafer scanning direction within the projection range in which the pattern effective area of the photo-mask is projected; and control means for containing at least one of the shot areas within the projection range to perform exposure of the device patterns provided in the pattern effective area of the photo-mask onto the shot area of the wafer and controlling and synchronizing the movements of the mask stage and the wafer stage while keeping the entire pattern effective area of the photo-mask contained within the illumination range.

The wafer stage of the above-described exposure apparatus preferably moves at a constant velocity or a substantially constant velocity so that a plurality of shot areas of the wafer is contained sequentially within the projection range.

The illumination unit of the above-described exposure apparatus preferably comprises a laser light source that emits pulse light, wherein the laser light source emits pulse exposure light at least one to perform exposure of the device patterns provided in the pattern effective area of the photo-mask onto one of shot areas of the wafer.

The above-described exposure apparatus preferably comprises a projection lens for projecting the pattern effective area of the photo-mask within the projection range, wherein the control means keeps the entire pattern effective area of the photo-mask contained within the field of view range of the projection lens while synchronizing and controlling the movements of the mask stage and the wafer stage.

The above-described exposure apparatus preferably satisfies the relationship:

$$D \geq ((Ma+Mb)^2 + Md^2)^{1/2}$$

where,

Ma: Length of pattern effective area of the photo-mask in the mask scanning direction;

Mb: Amount of movement of the photo-mask in the mask scanning direction when exposure is performed onto one of shot areas of the wafer:

Md: Width of the photo-mask; and

D: Diameter of the field of view range.

The above-described exposure apparatus preferably satisfies the relationship:

$$Ta \leq (Wa - Wb)/V$$

where,

Ta: Time after exposure of one shot area of the wafer is completed, then the mask stage is returned to the initial position in the mask scanning direction until synchronization is established with the wafer stage that has moved in the wafer scanning direction for an exposure of the next shot area of the wafer;

V: Moving velocity of the wafer stage;

Wa: Length of one shot area of the wafer in the wafer scanning direction; and

Wb: Amount of movement of the wafer in the wafer scanning direction when exposure is performed onto one shot area of the wafer.

The mask stage of the above-described exposure apparatus is preferably returned to an initial position for every one row or one column of consecutive shot areas of the wafer, and the time for returning to the initial position is made shorter than the time of movement for changing the row or column of the wafer stage in order to move to the next shot area.

The illumination unit of the above-described exposure apparatus preferably comprises an illumination sensor to determine whether a predetermined amount of exposure has been reached or not, and terminates pulse emission of the laser light source when the total amount of exposure of the illumination sensor has reached a predetermined amount of exposure.

The above-described exposure apparatus preferably comprises voltage measuring means for measuring an applied voltage of the laser light source, gas concentration measuring means for measuring gas concentration in a chamber of the laser light source and storing means for storing light emission history of the laser light source as data, wherein the laser light source calculates total exposure energy based on any one of or a combination of measurement results of the voltage measuring means and gas concentration measuring means or the light emission history data and controls from the calculation result so that the next pulse light emission reaches a predetermined level of exposure energy.

The illumination unit of the above-described exposure apparatus preferably comprises a micro mirror array for adjusting exposure energy in the light path, wherein the micro mirror array is controlled based on information of any one or a combination of the illumination sensor, the voltage control means, the gas concentration measuring means the light emission history data so that pulse light emission reaches a predetermined level of exposure energy.

The above-described exposure apparatus preferably controls the pulse light emission count for one shot area of the wafer under the relationship of $I \cdot S/(J \cdot P)$, where, I: Amount of required exposure per unit area;

S: Area of one shot area of the wafer;

J: Energy of one-time pulse light emission from the laser light source; and

P: Transmittance for light with exposure wavelength from the laser light source to the wafer.

Furthermore, the semiconductor device manufacturing method according to the present invention comprises the steps of:

installing a plurality of semiconductor manufacturing apparatuses, including the exposure apparatus, in a factory; and manufacturing semiconductor devices using the plurality of semiconductor manufacturing apparatuses.

The above-described semiconductor device manufacturing method preferably further comprises the steps of:

connecting the plurality of semiconductor manufacturing apparatuses via a local area network;

connecting the local area network and an external network outside the factory;

acquiring information on the exposure apparatus from a database on the external network using the local area network and the external network; and controlling the exposure apparatus based on the acquired information.

The semiconductor manufacturing factory according to the present invention comprises:

a plurality of semiconductor manufacturing apparatuses including an exposure apparatus;

a local area network that connects the plurality of semiconductor manufacturing apparatuses; and a gateway that connects the local area network and an external network outside the semiconductor manufacturing factory.

Furthermore, the maintenance method for exposure apparatus according the present invention comprises the steps of:

preparing a database for storing information on the maintenance of the exposure apparatus on an external network outside the factory in which the exposure apparatus is installed;

connecting the exposure apparatus to the local area network in the factory; and performing maintenance of the exposure apparatus based on information stored in the database using the external network and the local area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 illustrates a specific example of a user interface in the production system of semiconductor devices including the exposure apparatus according to the embodiment of the present invention;

DETAILED DESCRIPTION OF THE PREFERRED EMBODIMENTS

Preferred embodiments of the present invention will now be described in detail in accordance with the accompanying drawings.

Exposure Apparatus

Figure 1:
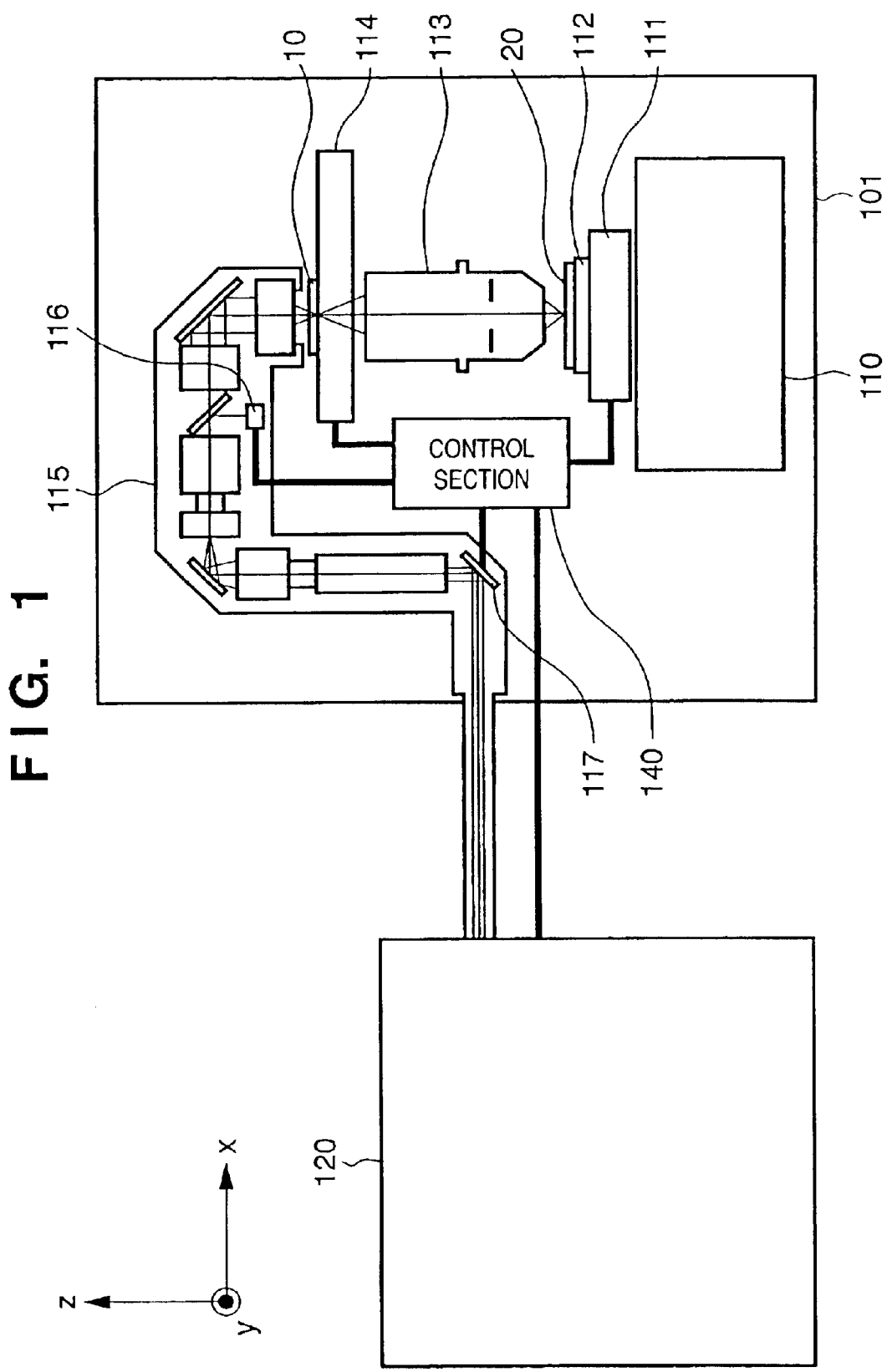
FIG. 1 is a drawing illustrating a structure of an exposure apparatus according to an embodiment of the present invention.

FIG. 1 is a drawing illustrating an overall configuration of an exposure apparatus 101 for manufacturing semiconductor devices, which is an embodiment of the present invention. This exposure apparatus 101 is intended to perform exposure of device patterns provided in a pattern effective area of a photo-mask 10 sequentially onto shot areas of a wafer 20. The respective shot areas are arrayed two-dimensionally on the wafer 20.

In FIG. 1, reference numeral 120 denotes a laser light source (unit) as the pulse light emission type light source such as a KrF or an ArF excimer laser and an $F_2$ laser, generating wavelengths of DUV (far-ultraviolet radiation) and VUV (vacuum ultraviolet radiation), etc. The laser light emitted as exposure light here is shaped by an illumination optical unit 115 and used to collectively illuminate the entire pattern effective area of the photo-mask 10 (one or a plurality of device patterns is provided therein). The illumination unit includes the light source 120 and illumination optical unit 115 and contains the entire pattern effective area of the photo-mask 10 within its illumination range.

In the optical path of the illumination optical unit 115 are an illumination sensor 116 to measure the illuminance of the laser light received from the laser light source unit 120 and a reflective mirror 117 using a micro mirror array. The photo-mask 10 is suctioned by means of a vacuum suction, etc., to or held on a mask stage 114, which is movable in the mask scanning direction on the xy plane in FIG. 1. Reference numeral 113 is a contracting projection lens having a predetermined contraction ratio (e.g., ¼) and contains the entire pattern effective area of the photo-mask 10 within its field of view range. All the device patterns provided in the pattern effective area of the photo-mask 10 collectively illuminated with the laser light as the exposure light shaped by the illumination optical unit 115 are introduced into the contracting projection lens 113 through the field of view range of the contracting projection lens 113 and the image of a device pattern provided in the pattern effective area of the mask 10 is projected and exposed (formed) on one shot area of the wafer 20 contained in the projection range of the contracting projection lens 113. A resist (photosensitive material) is applied to the wafer 20 and a latent image is formed by exposure. This wafer 20 is placed on a wafer stage 111 via a wafer chuck 112.

The wafer stage 111 (supported on support unit 110) moves the wafer 20 placed thereon within the plane of the stage (x-axis and y-axis directions), in the vertical direction (z-axis direction) or tilting or rotation direction around each axis and can control the positioning of the wafer 20. The positioning control in the z-axis direction of the wafer stage 111 achieves focus of the contracting projecting lens 113 on the wafer 20. On the other hand, the wafer stage 111 can move within the xy plane in the wafer scanning direction and the movement of the wafer stage 111 within the xy plane allows each shot area of the wafer to be positioned one by one within the projection range of the contracting projection lens 113.

In the control of movement and positioning of the mask stage 114 and the wafer stage 111, the position and posture of the stages are measured by a laser interferometer (not shown) and this positional information is fed back to the control side. Furthermore, the mask stage 114 and wafer stage 111 are connected by hardware to a control section 140 via a cable shown by the thick line in FIG. 1 and it is possible to provide synchronization control by transferring data in real time. The illumination sensor 116, laser light source unit 120 and micro mirror array 117 are also connected by hardware to the control section 140, thereby providing control synchronized with the exposure timing and movements of the stages 114 and 111. The control section 140 can also control exposure energy during real-time light emission for consecutive purposes.

Then, an exposure operation will be explained.

Figure 2:
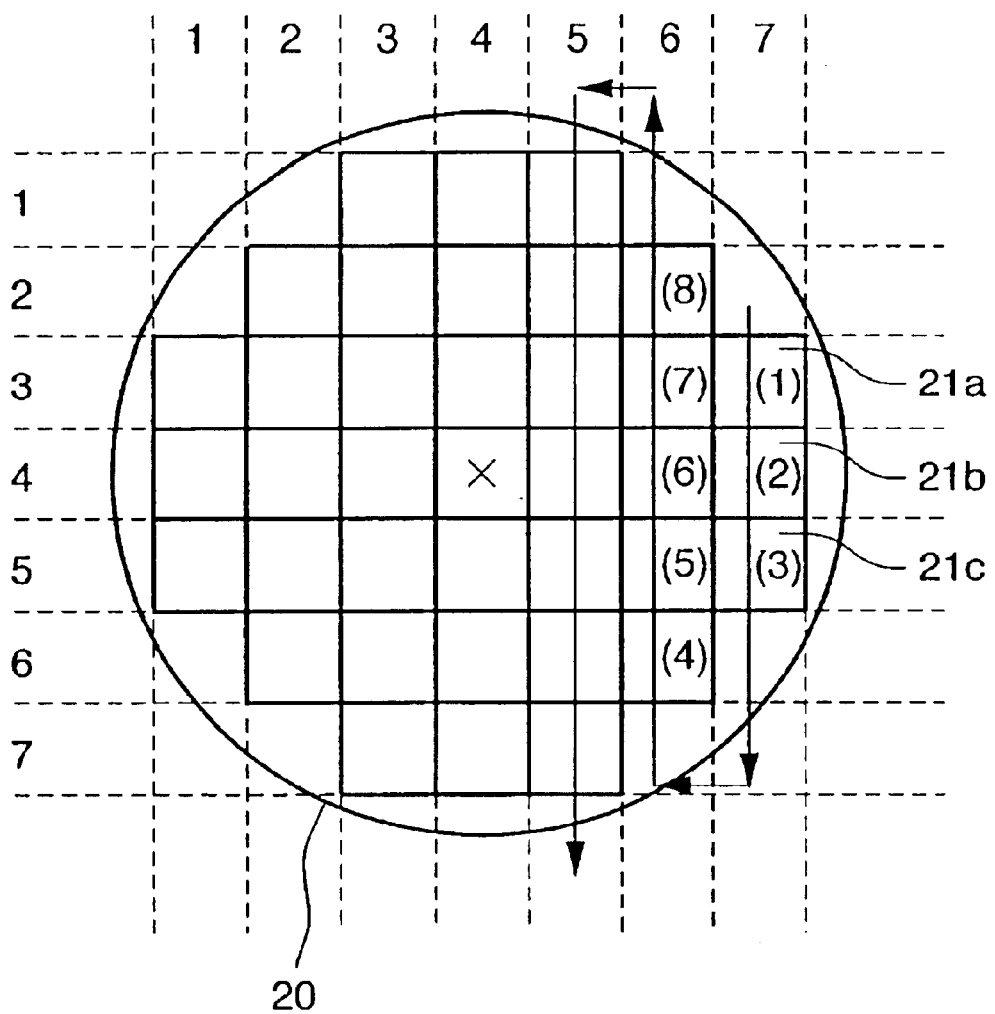
FIG. 2 is a drawing illustrating a shot layout and an exposure procedure during exposure using the exposure apparatus according to the embodiment of the present invention.

FIG. 2 shows a shot layout on the wafer 20 obtained by driving the surface of the wafer 20 into 7×7-matrix like shot areas and excluding the parts that are not contained within the wafer. Reference numerals 21a, 21b and 21c denote shot areas which become exposure units. The arrows in the figure indicate an exposure sequence of shot areas, indicating that exposure is performed in order of divided areas (1), (2), (3) . . . When exposure of shot areas corresponding to one column is completed, exposure continues onto shot areas on the next column in the same way.

Figure 3:
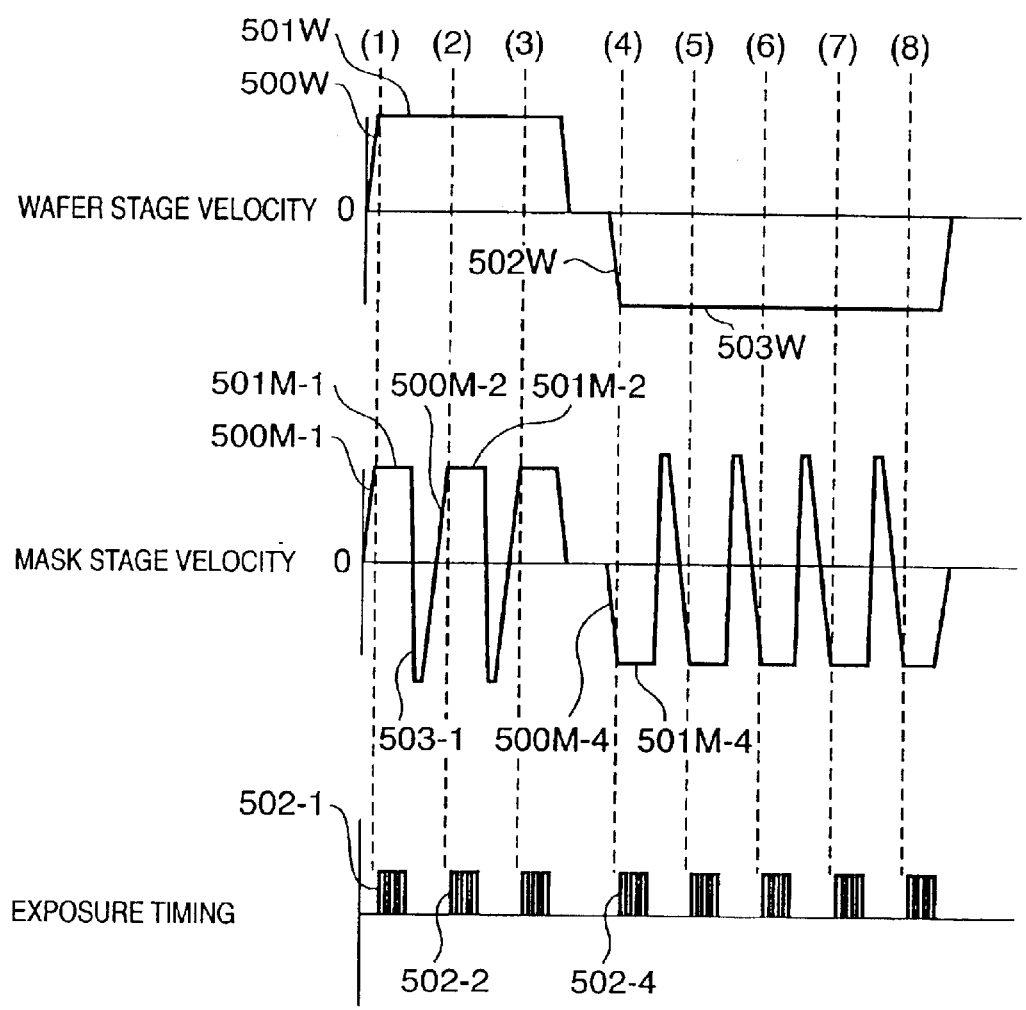
FIG. 3 is a drawing illustrating an exposure sequence by returning a mask for every one shot using the exposure apparatus according to the embodiment of the present invention.

FIG. 3 illustrates the velocities of the wafer stage 111 and mask stage 114 and exposure timing when exposure is performed onto the shot layout shown in FIG. 2. First, the wafer stage 111 and mask stage 114 increase their velocities (500W, 500M-1) in synchronization with each other in the wafer scanning direction and mask scanning direction, respectively, under the control of the control section 140 and start uniform or substantially uniform motion (hereinafter referred to as "uniform motion") at a point in time that the respective stages reach predetermined velocities and stay under synchronization control (501W, 501M-1). Here, the ratio of the velocity of the wafer stage 111 to the velocity of the mask stage 114 is equal to the contraction ratio of the contracting projection lens 113.

After one total shot area of the wafer 20 is contained within the projection range of the contracting projection lens 113, exposure (502-1) with exposure light starts simultaneously with the uniform motion of the wafer stage 111 and mask stage 114. (1), (2) . . . in FIG. 3 shows the correspondence with the shot layout in FIG. 2 and exposure onto each shot area with pulse light emission by the light source 102 continues until a predetermined amount of exposure is obtained for every shot area and then terminates.

The control section 140 synchronizes and controls the wafer stage 111 and mask stage 114 for at least this while, keeps the entire pattern effective area of the photo-mask 10 contained within the illumination range of the illumination optical unit 116, and while keeping one exposure target shot area of the wafer 20 contained within the projection range of the contracting projection lens 113 and while both stages are moving at a constant velocity, controls so that the sum total of amounts of exposure in the shot area becomes constant by performing exposure of device patterns in the pattern effective area onto the exposure target shot areas through pulse light emission from the light source 102 one or a plurality of times.

Then, while letting the wafer stage 111 move at a constant velocity in the wafer scanning direction, the control section 140 lets the mask stage 114 recede until the pattern effective area of the photo-mask 10 returns to the initial position in the mask scanning direction, that is, carries out a home position restoration operation (503-1) in preparation for the next shot area. After this, the control section 140 accelerates and controls the mask stage 114 again (500M-2) and changes the control over the mask stage 114 to uniform motion at a point in time that the mask stage 114 reaches a predetermined velocity and synchronization with the wafer stage 111 is established, and starts exposure in the next shot area (502-2) ((2) in FIG. 3). When the processing up to the shot area (3)

is completed in such an operation sequence, the control section 140 performs a movement control over the wafer stage 111 in the reversed moving direction in order to perform exposure corresponding to the sequence of (4) (5) (6) (7) (8) of the shot layout shown in FIG. 2. That is, the control section 140 accelerates the wafer stage 111 in the direction opposite to the direction of areas (1) to (3) (502W) and changes to a uniform motion when a predetermined velocity is reached (503W). In this case, the control section 140 accelerates the mask stage 114 simultaneously with the movement of the wafer stage 111 (500M-4), changes to a uniform motion (501M-4) when a predetermined velocity is reached and synchronization of uniform motion with the wafer stage 111 is established and starts exposure onto the corresponding shot area (e.g., 502-4).

In this case, suppose the moving velocity of the wafer stage 111 is V, the length of one shot area of the wafer 20 in the wafer scanning direction is Wa, the amount of movement of the wafer 20 in the wafer scanning direction when exposure is performed onto one shot area of the wafer 20 is Wb, the amount of required exposure per a unit area is I, the area of one shot area of the wafer 20 is S, the energy of one-time pulse light emission from the laser light source 102 is J, the transmittance for the light with an exposure wavelength from the laser light source 102 to the wafer 20 is P. Then, pulse emission count (exposure count) n corresponding to one shot area of the wafer 20 is given in expression (a) below:

$$n = I \cdot S / (J \cdot P) \quad \text{(a)}$$

From this, the time required for exposure is given by expression (b):

$$Wb/V = I \cdot S / (F \cdot J \cdot P) \quad \text{(b)}$$

Furthermore, when the mask stage 114 is returned for every one shot area, if the time after exposure of a shot area is completed, the mask stage 114 is returned to the initial position in the mask scanning direction until synchronization with the wafer stage 111 moving in the wafer scanning direction for exposure of the next shot area of the wafer 20 is established is Ta, then the condition of the following expression (c) must be satisfied because the returning of the mask stage 114 must have been completed before the next shot area:

$$Ta \leq (Wa - Wb)/V \quad \text{(c)}$$

Calculation Example

For example, a calculation example with specific exposure conditions set is shown below.

Suppose the moving velocity of the wafer stage 111 is V=0.2 m/s, the length of one shot area of the wafer 20 in the wafer scanning direction Wa=0.03 m, the amount of necessary exposure I=100 J/m², the area S=6×10⁻⁴ m², the energy of a one-time pulse light emission J=0.2J, the transmittance of exposure wavelength P =5%, the repetitive frequency F =500 Hz, then the pulse light emission count n (exposure count) necessary for one shot area is:

$$n = 100 \times 6 \times 10^{-4} / (0.2 \times 0.05) = 6 \text{ (times)}.$$

Therefore, under the above conditions, when exposure of the same pattern is performed and divided into a plurality of times, it is possible for the laser light source 102 to emit pulse light six times for exposure of a one-shot area. It goes without saying that as these conditions change, the pulse light count n necessary for exposure of the one-shot area also changes. For example, if a light source with a long light emission time (with a long pulse life) is used instead of a pulse light emission type light source with a short light emission time or a light source with consecutive light emissions is used, the light emission count (exposure count) required may be one.

Furthermore, the time Ta after exposure of the previous shot area is completed until exposure of the next shot area starts is:

$$(Wa - Wb)/V = (0.03 - 0.2 \times 6 / 500) / 0.2 = 0.138 \text{ (sec)}.$$

Therefore, if the mask stage 114 is returned for every shot area, it is possible to return the pattern effective area of the mask 10 to the initial position and then accelerate the mask stage 114 again and establish synchronization of both stages within the time Ta=0.138 sec.

Figure 4:
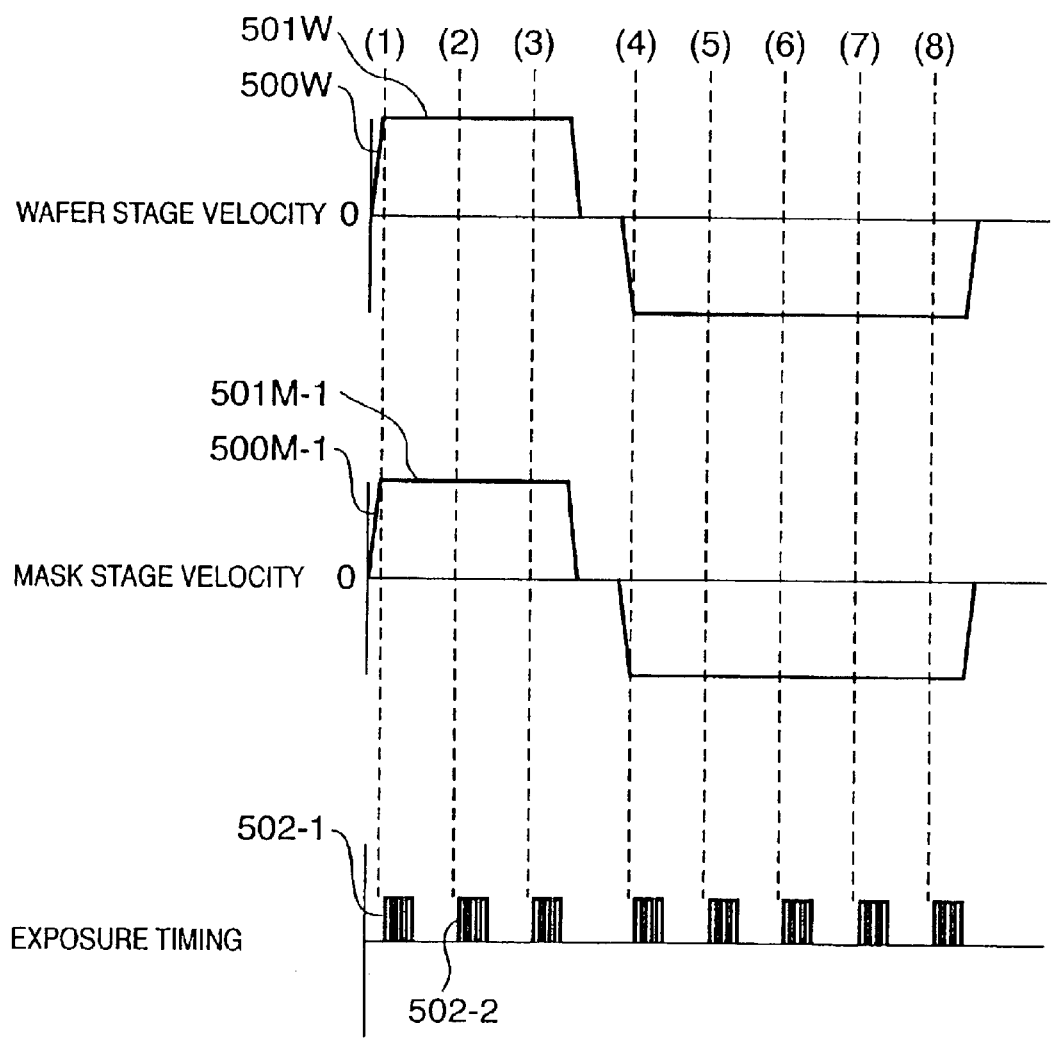
FIG. 4 is a drawing illustrating an exposure sequence by returning a mask for every one row (or one column) of a shot layout using the exposure apparatus according to the embodiment of the present invention.

FIG. 4 shoes a sequence of returning the mask stage 114 after applying exposure to shot areas corresponding to one row or one column collectively without performing the operation of returning the mask stage 114 for every one shot area and performing exposure by inverting the moving direction of the stages. In this case, the control section 140 can synchronize the wafer stage 111 with the mask stage 114 more completely and can perform scanning and exposure with the relative positional relationship between the effective pattern area of the photo-mask 10 within the illumination range and the exposure target shot area of the wafer 20 within the projection range kept highly accurate through synchronization control.

In order to move the wafer stage 111 at a constant velocity within at least a predetermined projection range and to start exposure during the uniform motion, the control section 140 synchronizes and controls the wafer stage 111 and the mask stage 114 so that the mask stage 114 moves at a constant velocity with a predetermined velocity ratio with respect to the wafer stage 111 and controls the exposure energy of laser light emission from the laser light source unit 120 produced one time or a plurality of times and given to the shot areas during the synchronization control.

Getting the same pattern in the pattern effective area of the mask 10 exposed onto the shot areas on the wafer 20 one time or a plurality of times while continuously moving the wafer stage 111 in the wafer scanning direction makes it possible to eliminate the necessity for control over influences of the setting, stop and time required for acceleration/deceleration of the wafer stage 111, complicated synchronization between the stage 111 and optical elements such as the contracting projection lens 113, thus improving throughput. Furthermore, synchronizing the position of the stage and the light emission timing of the laser light source 102 makes it possible to form an exposure pattern at an accurate position.

When the above exposure operation is performed, the entire pattern effective area of the photo-mask 10 needs to be contained within the illumination range of the illumination optical unit 115 and the field of view range of the contracting projection lens 113 from the start to the end of exposure. That is, during exposure of one-shot area or exposure corresponding to one row (or one column) of the shot layout, the photo-mask area regulated by the amount of movement Mb of the photo-mask 10 and the size of the pattern effective area of the mask 10 (length Ma of the pattern effective area in the mask scanning direction and width Md of pattern effective area) needs to be within the illumination range of the illumination optical unit 115 and the field of view range of the projection lens 113.

Figure 5:
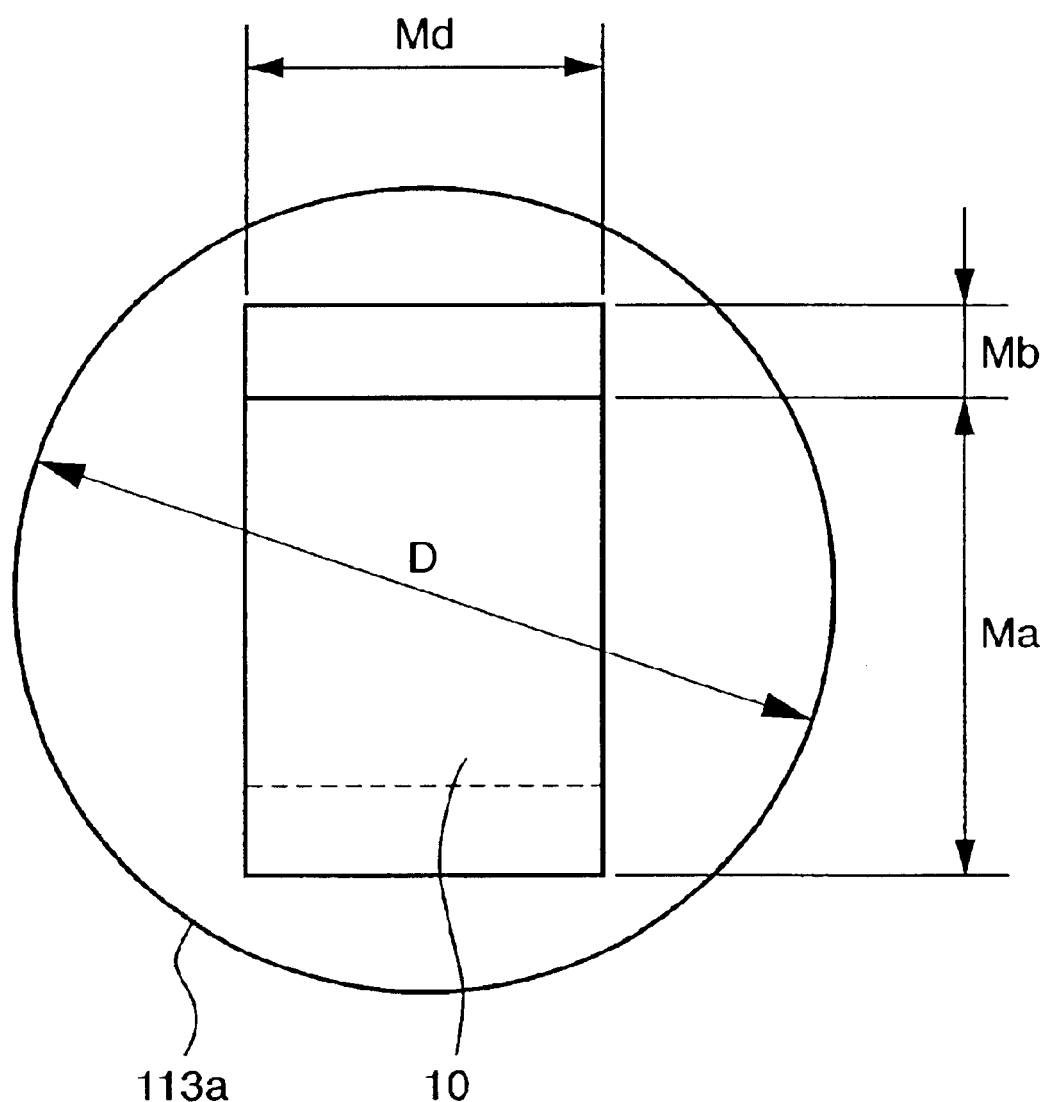
FIG. 5 is a drawing illustrating a relationship between a photo-mask movable range and a field of view range of a projection lens using the exposure apparatus according to the embodiment of the present invention.

FIG. 5 shows a schematic view of a relationship between the photo-mask area (pattern effective area) and the effective field of view range of the contracting projection lens 113. Reference numeral 113a denotes the effective field of view range, which becomes the field of view range of the projection lens 113, Ma denotes the length of the photo-mask area (pattern effective area) in the mask scanning direction, and Mb denotes the amount of movement of the photo-mask area (pattern effective area) until exposure of one shot area or one row (one column) is completed. Furthermore, suppose the width of the photo-mask area (pattern effective area) is Md and the diameter of the effective field of view range of the contracting projection lens 113 is D. Then, the relationship in expression (d) is set up.

$$D \geq ((Ma+Mb)^2+Md^2)^{1/2} \qquad (d)$$

By satisfying the relationship in expression (d), the illumination optical unit 115 and projection lens 113 can secure the photo-mask area (pattern effective area) of the photo-mask 10 within the illumination range and field of view range from the start to the end of exposure. Securing the photo-mask area (pattern effective area) of the photo-mask 10 within such ranges during exposure allows collective projection and exposure of the device patterns onto the shot areas, eliminates the necessity for carrying out exposure divided into a plurality of times and can thereby improve throughput without the need for complicated control from the standpoint of control of the mask stage 114.

Furthermore, the illumination optical unit 115 comprises the illumination sensor 116 as means for measuring an amount of exposure and the illumination sensor 116 measures illumination at the time of each exposure and records data in memory (not shown). The control section 140 can also calculate the sum total of recorded data and complete exposure when a predetermined amount of exposure is reached. Measuring the amount of exposure every time using the illumination sensor 116 makes it possible to monitor the amount of exposure, and controlling the amount of exposure to a predetermined amount of exposure based on the measurement allows exposures with correct line widths.

Furthermore, with a sensor (not shown) placed in the laser light source unit 102 to measure an applied voltage, gas concentration in the laser chamber, gas pressure, amount of ions, etc., and with reference to data stored in memory, etc., the control section 140 calculates power required for the next exposure. For example, it is also possible to keep the exposure energy constant by controlling the applied voltage.

Furthermore, the control section 140 can also operate the micro mirror array 117 in the illumination optical unit 115 based on the output data of the illumination sensor 116 to control the exposure energy. The micro mirror array 117 is a device that controls reflected light by operating millions of micro mirrors as appropriate. When the amount of exposure is greater than average at a point in time, the control section 140 can operate the micro mirror array 117 to control the laser light that passes. It is also possible to measure the physical amount involving the light emission energy in this illumination sensor 116 or the laser light source unit 102, to control the micro mirror array 117 in real time and to control the amount of exposure. When control of the amount of exposure using the micro mirror array is not performed, the micro mirror array 117 may be constituted by normal mirrors.

The above embodiment describes the case wherein the device patterns provided in the pattern effective area of the mask 10 are projected and exposed onto shot areas of the wafer 20 via the contracting projection lens 113. However, the present invention is also applicable to a so-called proximity type exposure apparatus that performs exposure by placing the mask 10 and wafer 20 in proximity to each other without using the contracting projection lens 113. Furthermore, in the case of a projection optical system with a field of view range that can contain the entire pattern effective area of the mask 10, the present invention is also applicable even if the projection optical system at least partially uses a mirror or reflective plane.

Embodiment of a Semiconductor Production System

Then, an example of a semiconductor device (e.g., a semiconductor chip such as an IC and LSI, an LCD panel, a CCD, a thin-film magnetic head, micromachines, etc.) production system using the above-described exposure apparatus will be explained. This is a system that performs maintenance services such as handling of trouble of the manufacturing apparatus installed in a semiconductor manufacturing factory, periodic maintenance and supply of software, etc., using a computer network outside the manufacturing factory.

Figure 6:
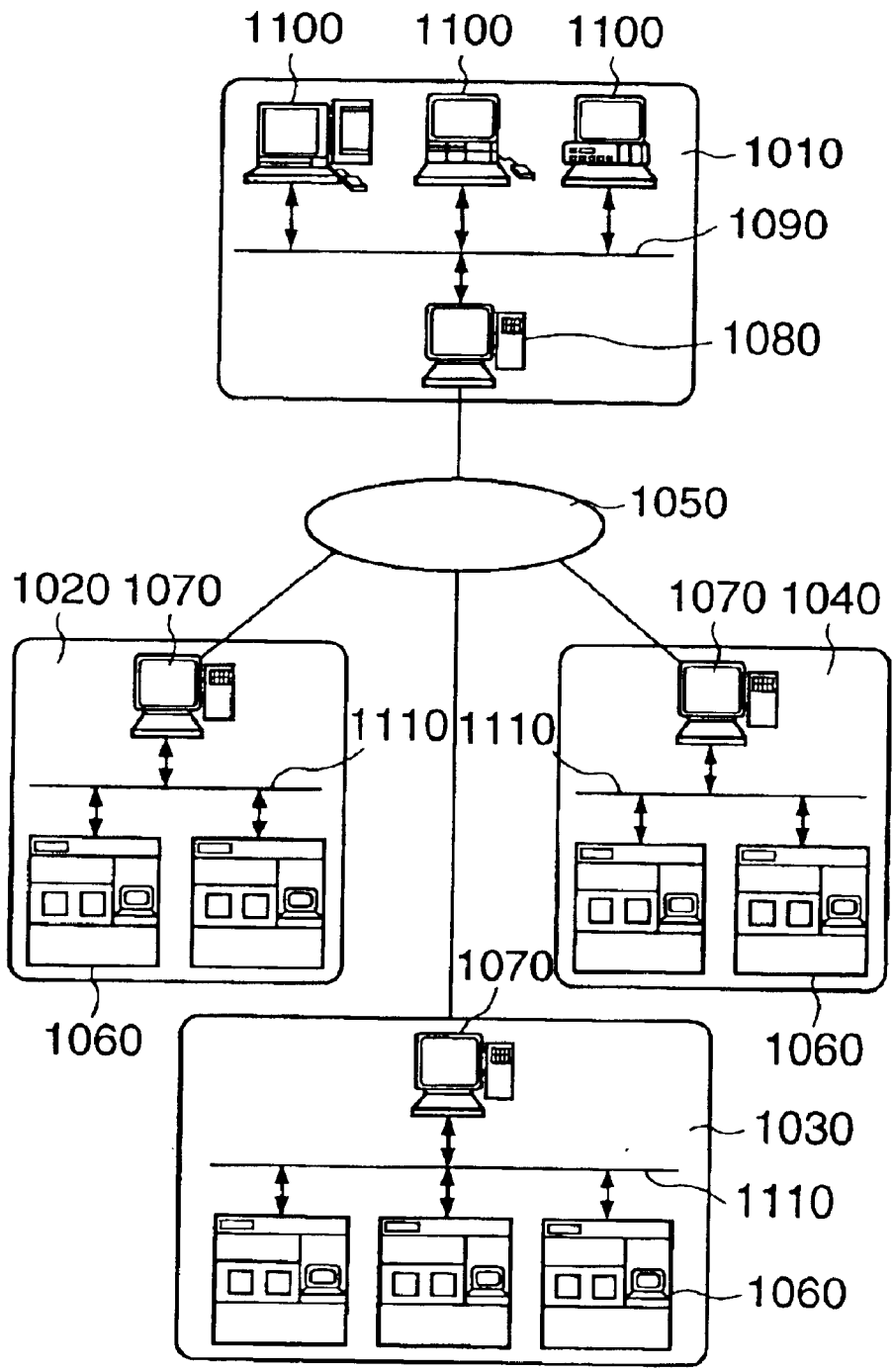
FIG. 6 is a conceptual diagram of a production system of semiconductor devices including the exposure apparatus according to the embodiment of the present invention viewed from a certain angle.

FIG. 6 is a view of the overall system extracted from a certain side. In FIG. 6, reference numeral 1010 denotes the office of the vendor (e.g., an apparatus supplier) who supplies a semiconductor device manufacturing apparatus. Actual examples of the manufacturing apparatus include a semiconductor manufacturing apparatus for performing various processes used in a semiconductor manufacturing factory, for example, pre-process equipment (e.g., lithography apparatus such as an exposure apparatus, a resist processor, an etching apparatus and a thermal processor, a film formation apparatus, a flattening apparatus, etc.) and post-process equipment (e.g., an assembly apparatus, an inspection apparatus, etc.). The office 1010 is equipped with a host control system 1080 that supplies a maintenance database for the manufacturing apparatus, a plurality of operation terminal computers 1100 and a local area network (LAN) 1090 that constructs an intranet by connecting these computers. The host control system 1080 is equipped with a gateway to connect the LAN 1090 to the Internet 1050, which is a network outside the office and a security function to restrict access from the outside.

On the other hand, reference numeral 1020 to 1040 denote manufacturing factories of semiconductor manufacturers who are the users of the manufacturing apparatuses. Manufacturing factories 1020 to 1040 may be factories belonging to manufacturers different from each other or may be factories belonging to the same manufacturer (for example, a pre-process factory and a post-process factory, etc.). The factories 1020 to 1040 are each equipped with a plurality of manufacturing apparatuses 1060, a local area network (LAN) 1110 that connects these apparatuses to construct an intranet and a host control system 1070 as a monitoring apparatus for monitoring the operation situation of each manufacturing apparatus 1060. The host control system 1070 provided for each factory 1020 to 1040 is equipped with a gateway to connect the LAN 1110 in each factory to the Internet 1050, which is a network outside the factory. This allows the users from the LAN 1110 in each factory to access the host control system 1080 on the vendor 1010 side via the Internet 1050. Here, typically, only users restricted by the security function of the host control system 1080 are allowed to access the host control system 1080.

In this system it is possible to notify status information indicating the operating situation of each manufacturing apparatus 1060 (for example, situation of manufacturing apparatus in which trouble occurs) from the factory to the vendor or send information of a response to the notification (for example, information indicating a troubleshooting method, troubleshooting software or data), a maintenance information such as latest software and help information, etc., from the vendor to the factory. For data communications between each factory 1020 to 1040 and the vendor 1010 and for data communications between LANs 1110 in the respective factories, a communication protocol (TCP/IP) generally used over the Internet is used. Instead of using the Internet as the external network outside the factories, it is also possible to use a dedicated network (e.g, an ISDN, etc.) with high security preventing a third party's access. Furthermore, the host control system is not limited to the one supplied by the vendor, but the user can also construct a database, place it on an external network and allow a plurality of the user factories to access the relevant database.

Figure 7:
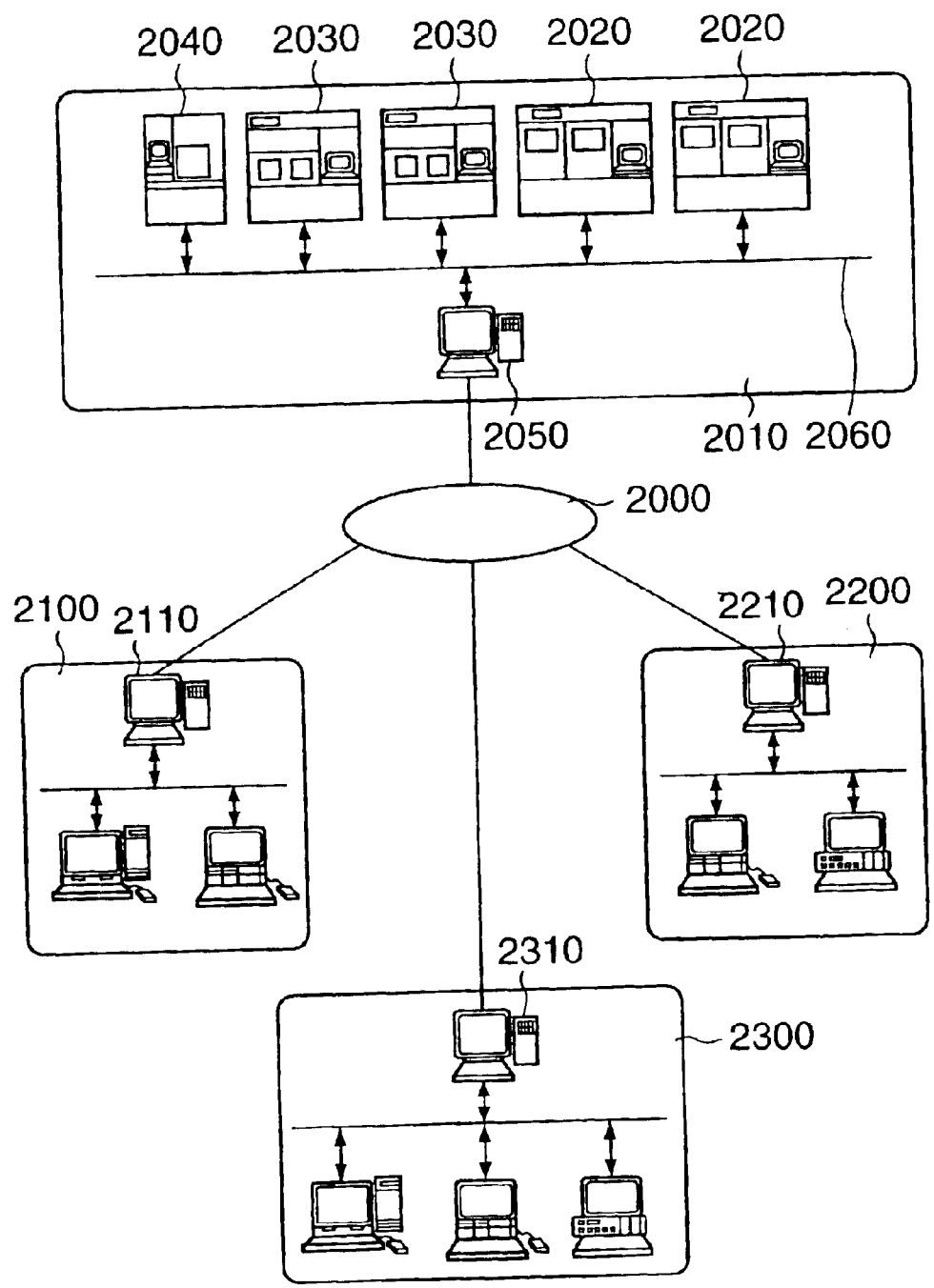
FIG. 7 is a conceptual diagram of the production system of semiconductor devices including the exposure apparatus according to the embodiment of the present invention viewed from another angle.

Now, FIG. 7 is a conceptual diagram of the overall system of this embodiment extracted from a side different from that in FIG. 6. The foregoing example describes the case wherein a plurality of user factories each equipped with a manufacturing apparatus and the control system of the vendor of the manufacturing apparatus are connected via an external network and production control of each factory and data communication of information of at least one manufacturing apparatus are carried out via the external network. In contrast, this example describes a case wherein a factory equipped with a plurality of manufacturing apparatuses of a plurality of vendors, the plurality of manufacturing apparatuses and the control systems of the respective vendors are connected via an external network outside the factory and maintenance information of each manufacturing apparatus is communicated with each other. In FIG. 7, reference numeral 2010 denotes a manufacturing factory of the manufacturing apparatus user (semiconductor device manufacturer) and the manufacturing line of the factory introduces manufacturing apparatuses for carrying out various processes, here, for example, an exposure apparatus 2020, a resist processor 2030 and a film formation processor 2040. FIG. 7 describes only one manufacturing factory 2010, but a plurality of factories is actually connected via a network in a similar way. The respective apparatuses in the factory are connected via a LAN 2060 to form an intranet and the host control system 2050 controls movements of the manufacturing line. On the other hand, offices of vendors (e.g., apparatus suppliers), such as an exposure apparatus manufacturer 2100, a resist processor manufacturer 2200 and a film formation apparatus manufacturer 2300 are each equipped with host control systems 2110, 2210 and 2310 for carrying out remote maintenance of the supplied apparatuses and these systems are each equipped with a maintenance database and a gateway, which is an external network, as described above. The host control system 2050 that controls the apparatuses in the user manufacturing factory and the vendor control systems 2110, 2210 and 2310 for the respective apparatuses are connected via the Internet, which is an external network 2000 or a dedicated network. If trouble occurs in any one of a series of apparatuses on this manufacturing line, the manufacturing line ceases to operate, but by receiving remote maintenance from the vendor of the apparatus in trouble via the Internet 2000, it is possible to cope with the trouble and to suppress the interruption of the manufacturing line to a minimum.

The manufacturing apparatuses installed in the semiconductor manufacturing factory are each equipped with a display, a network interface, and a computer that executes network access software stored in a storage device and software for operation of the apparatus. As the storage device, a built-in memory, hard disk or network file server, etc., is available. The above-described network access software includes a dedicated or general-purpose web browser and provides on a display a user interface with a screen whose example is shown in FIG. 8. The operator who controls the manufacturing apparatus in each factory enters information such as the model (4010) of the manufacturing apparatus, serial number (4020), name of trouble (4030), date of occurrence (4040), emergency level (4050), symptom (4060), remedy (4070), progress (4080), et., in input items on the screen with reference to the screen. The information entered is sent to a maintenance database via the Internet and the resulting appropriate maintenance information is replied from the maintenance database and shown on the display. Furthermore, the user interface provided by the web browser further provides hyper link functions (4100 to 4120) as shown in the figure, allowing the operator to access further detailed information of each item, extract software of the latest version to be used for the manufacturing apparatus from a software library provided by the vendor or extract an operation guide (help information) to be used as a reference for the factory operator.

Figure 9:
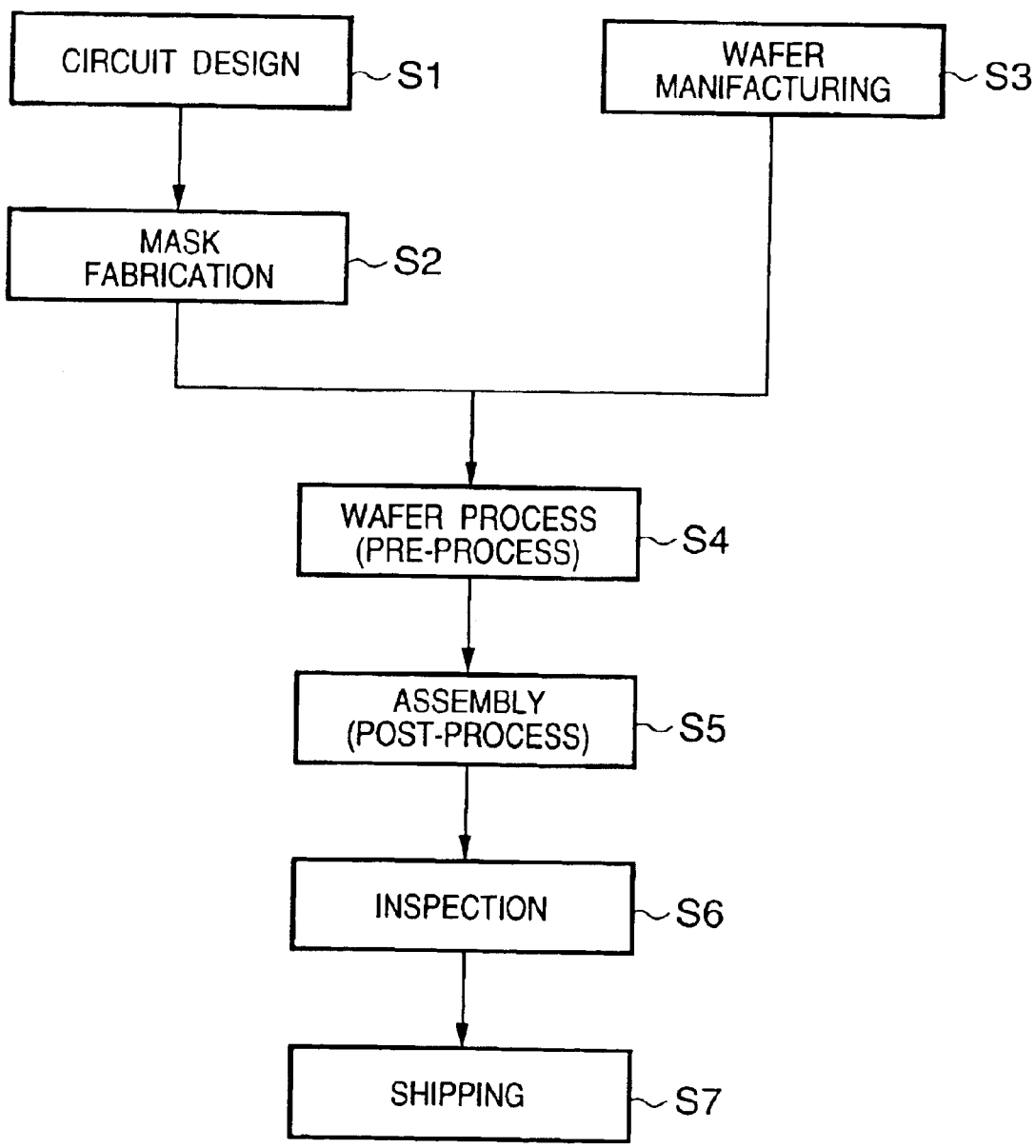
FIG. 9 is a drawing illustrating a flow of a semiconductor device manufacturing process using the exposure apparatus according to the embodiment of the present invention.

Then, the manufacturing process of the semiconductor devices using the above-described production system will be explained. FIG. 9 shows a flow of an overall manufacturing process of manufacturing semiconductor devices. In step 1 (circuit design), a circuit design for a semiconductor device is carried out. In step 2 (creation of exposure control data), exposure control data of the exposure apparatus is created based on the designed circuit pattern. On the other hand, in step 3 (wafer manufacturing), a wafer is manufacturing using a material such as silicon. Step 4 (wafer process) is called a "pre-process" in which an actual circuit is formed on the wafer using the mask and wafer prepared above using lithography technology. The next step 5 (assembly) is called a "post-process" and is a step in which a semiconductor chip is created using the wafer manufactured in step 4 and includes assembly processes such as an assembly process (dicing, bonding), a packaging process (chip sealing), etc. In step S6 (inspection), the semiconductor device manufactured in step 5 is subjected to an operation check test, a resistance test, etc. The semiconductor device is completed through these processes and shipped (step 7). The pre-process and post-process may be carried out at different dedicated factories, and in this case, maintenance is performed using the above-described remote-controlled maintenance systems at the respective factories. Between the pre-process factory and post-process factory, information for production control and maintenance of the apparatuses may be communicated with each other via the Internet or a dedicated network.

Figure 10:
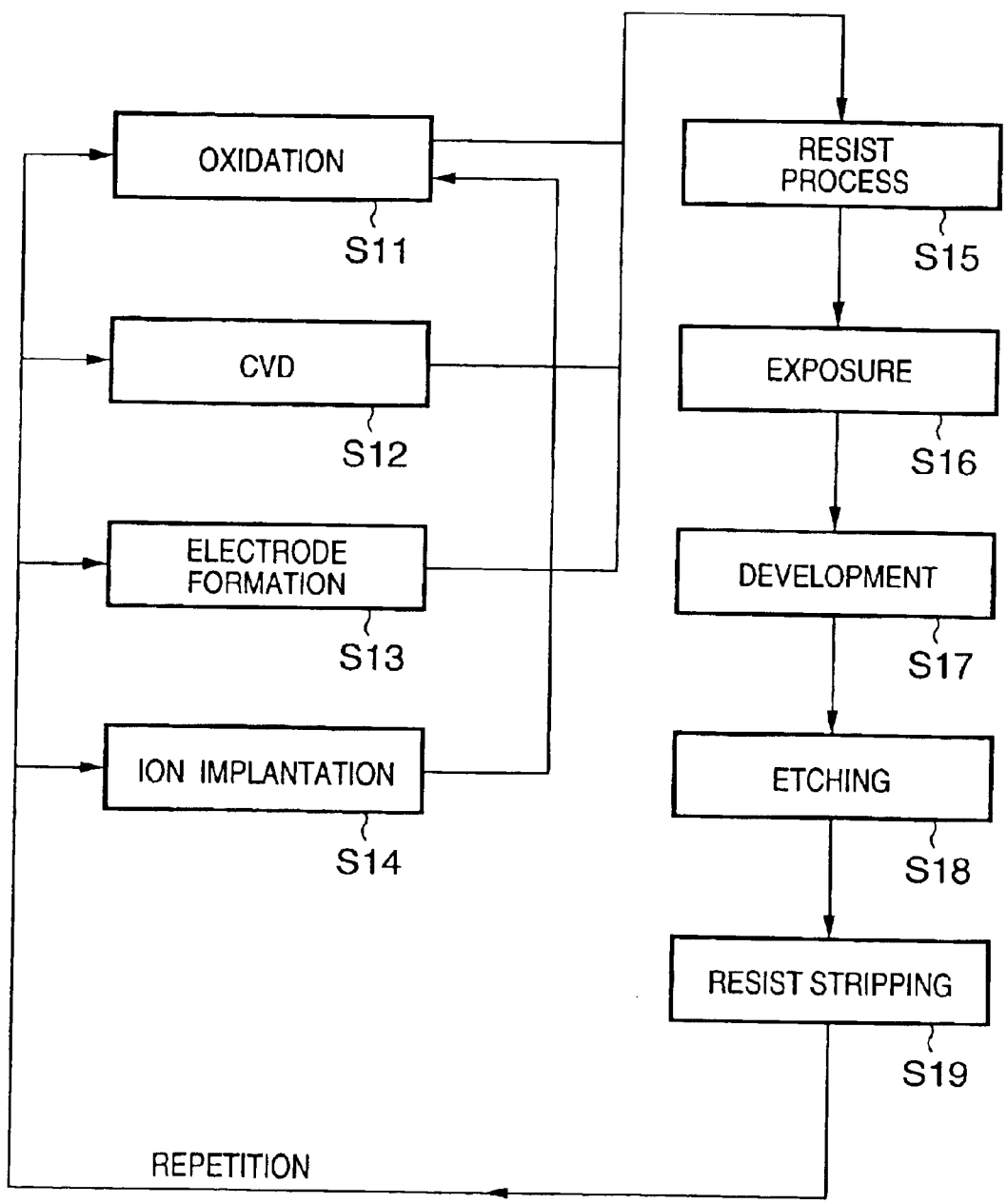
FIG. 10 is a drawing illustrating a wafer process using the exposure apparatus according to the embodiment of the present invention.

FIG. 10 shows a detailed flow of the above-described wafer process. In step 11 (oxidation), the surface of a wafer is oxidized. In step 12 (CVD), an insulation film is formed on the surface of the wafer. In step 13 (formation of electrodes), electrodes are formed on the wafer by means of vapor deposition. In step 14 (ion implantation), ions are implanted into the wafer. In step 15 (resist processing), a photosensitive material is applied to the wafer. In step 16 (exposure), the above-described exposure apparatus draws (exposes) the circuit pattern on the wafer. In step 17 (development), the exposed wafer is developed. In step 18 (etching), the portion other than the developed resist image is chipped off. In step 19 (resist stripping), the unnecessary resist after the etching is removed. By repeating these steps, multiple circuit patterns are formed on the wafer. The manufacturing apparatus used for each process is subjected to maintenance using the above-described remote-controlled maintenance system, which prevents trouble, or even if trouble occurs, it is possible to recover the original condition, thus improving productivity of semiconductor devices compared to the conventional systems.

As described above, by getting the same pattern in the pattern effective area of the mark exposed onto a shot area on the wafer one time or a plurality of times while continuously moving the wafer stage in the wafer scanning direction, the exposure apparatus according to the present invention makes it possible to eliminate the necessity for control of influences of the setting, stoppage and time required for acceleration/deceleration of the wafer stage, and complicated synchronization between the stage and optical elements, thus improving throughput.

Furthermore, the exposure apparatus according to the present invention can secure the photo-mask area (pattern effective area) of the photo-mask within the illumination range from the start to the end of the exposure. Securing the photo-mask area (pattern effective area) of the photo-mask in such a range during exposure allows collective exposure of the device pattern onto the shot areas, eliminates the necessity for carrying out exposure divided into a plurality of times and can thereby improve throughput without complicated control from the standpoint of control of the mask stage.

Furthermore, by measuring the amount of exposure every time using the illumination sensor, the exposure apparatus according to the present invention makes it possible to monitor the amount of exposure and controlling the amount of exposure to a predetermined amount of exposure based on the measurement allows exposures with correct line widths.

Furthermore, the exposure apparatus according to the present invention can form exposure patterns at precise positions by synchronizing the position of the stage and laser light emission timing.

Furthermore, the exposure apparatus according to the present invention can provide stable exposure energy by controlling the exposure energy.

Furthermore, the exposure apparatus according to the present invention can provide stable illumination by controlling exposure energy by operating the micro mirror array.

The semiconductor device manufacturing method and method of performing maintenance of the exposure apparatus according to the present invention can form circuit patterns on a wafer with high accuracy and the exposure apparatus used for the manufacturing process is subjected to maintenance by the remote-controlled maintenance system, which prevents trouble or even if trouble occurs, it is possible to recover the original condition, thus improving productivity of semiconductor devices compared to the conventional systems.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus for sequentially performing projection exposure via a projection optical unit of device patterns provided in a pattern effective area of a photo-mask onto shot areas of a wafer, said apparatus comprising:

an illumination unit for collectively illuminating the entire pattern effective area of the photo-mask, which area is contained within the illumination range of said illumination unit, with exposure light;

a mask stage that moves the photo-mask in the mask scanning direction within the illumination range;

a wafer stage that moves the wafer in accordance with a projection range in which the pattern effective area of the photo-mask is projected in one of the mask scanning direction and a direction opposite to the mask scanning direction; and control means for synchronizing and controlling the relative movements of said mask stage and said wafer stage while keeping an entire shot area of the wafer contained within the projection range, in which device patterns illuminated collectively are projected via the projection optical unit.

2. The exposure apparatus according to claim 1, wherein said wafer stage moves at a constant velocity or at a substantially constant velocity thereby keeping a plurality of shot areas of the wafer contained sequentially within the projection range.

3. The exposure apparatus according to claim 2, wherein said illumination unit comprises a laser light source that emits pulse light, and said laser light source emits pulse exposure light at least once to perform exposure of device patterns provided in the pattern effective area of the photo-mask onto one of the shot areas of the wafer.

4. The exposure apparatus according to claim 3, further comprising:

a projection lens for projecting the pattern effective area of the photo-mask onto the projection range, wherein said control means keeps the entire pattern effective area of the photo-mask contained within the field of view range of said projection lens while synchronizing and controlling the movements of said mask stage and said wafer stage.

5. The exposure apparatus according to claim 4, wherein the exposure apparatus satisfies the relationship:

$$D \geq ((Ma+Mb)^2 + Md^2)^{1/2}$$

where,

Ma: Length of the pattern effective area of the photo-mask pattern in the mask scanning direction Mb: Amount of movement of the photo-mask in the mask scanning direction when exposure is performed onto one of the shot areas of the wafer Md: Width of the photo-mask D: Diameter of the field of view range.

6. The exposure apparatus according to claim 4, wherein the exposure apparatus satisfies the relationship:

$$Ta \leq (Wa-Wb)/V$$

where,

Ta: Time after exposure of one shot area of the wafer is completed, then the mask stage is returned to the initial position in the mask scanning direction until synchronization is established with the wafer stage that has moved in the wafer scanning direction for an exposure onto the next shot area of the wafer V: Moving velocity of said wafer stage Wa: Length of one shot area of the wafer in the wafer scanning direction Wb: Amount of movement of the wafer in the wafer scanning direction when exposure is performed onto one shot area of the wafer.

7. The exposure apparatus according to claim 4, wherein said mask stage is returned to an initial position for every one row or one column of consecutive shot areas of the wafer, and the time for returning to the initial position is shorter than the time for movement for changing the row or column of said wafer stage in order to move to the next shot area.

8. The exposure apparatus according to claim 4, wherein said illumination unit comprises an illumination sensor to determine whether a predetermined amount of exposure has been reached or not, and terminates pulse emission of said laser light source when the total amount of exposure of said illumination sensor has reached the predetermined amount of exposure.

9. The exposure apparatus according to claim 4, further comprising:

voltage measuring means for measuring an applied voltage of said laser light source;

gas concentration measuring means for measuring gas concentration in a chamber of said laser light source; and storing means for storing a light emission history of said laser light source as data, wherein said laser light source calculates total exposure energy based on information of any one of or a combination of measurement results of said voltage measuring means and gas concentration measuring means or the light emission history data and controls based on said calculation result so that the next pulse emission reaches predetermined exposure energy.

10. The exposure apparatus according to claim 4, wherein said illumination unit comprises a micro mirror array for adjusting exposure energy in the light path, and said micro mirror array is controlled based on information of any one or a combination of said illumination sensor, said voltage control means, said gas concentration measuring means and the light emission history data so that pulse light emission reaches predetermined exposure energy.

11. The exposure apparatus according to claim 4, wherein one or a plurality of device patterns is provided in the pattern effective area of the photo-mask.

12. The exposure apparatus according to claim 4, wherein the pulse light emission count for one shot area of the wafer is controlled under the relationship $I \cdot S/(J \cdot P)$ where, I: Amount of required exposure per unit area S: Area of one shot area of the wafer J: One-time pulse light emission energy from said laser light source P: Transmittance for light of exposure wavelength from said laser light source to the wafer.

* * * * *

UNITED STATES PATENT AND TRADEMARK OFFICE
CERTIFICATE OF CORRECTION

PATENT NO. : 6,736,928 B2
DATED : May 18, 2004
INVENTOR(S) : Kenichi Kotoku

It is certified that error appears in the above-identified patent and that said Letters Patent is hereby corrected as shown below:

Drawings,
Sheet 9, FIG. 9, in step "S3," "MANIFACTURING" should read
-- MANUFACTURING --.

Column 1,
Line 27, "the" should be deleted.

Column 4,
Line 5, "according" should read -- according to --.

Column 7
Line 30, "$n=I \cdot S(J \cdot P)$" should read -- $n=I \cdot S/(J \cdot P)$ --.

Column 8,
Line 18, "shoes" should read -- shows --.

Column 12,
Line 12, "et.," should read -- etc., --.

Signed and Sealed this

Twenty-third Day of November, 2004

JON W. DUDAS
*Director of the United States Patent and Trademark Office*